United States Patent

Kim

[11] Patent Number: 6,069,036
[45] Date of Patent: May 30, 2000

[54] METHOD OF FABRICATING SEMICONDUCTOR DEVICE

[75] Inventor: Jae-Kap Kim, Ich'on, Rep. of Korea

[73] Assignee: Hyundai Electronics Industries Co., Ltd., Ich'on, Rep. of Korea

[21] Appl. No.: 08/774,190

[22] Filed: Dec. 26, 1996

[30] Foreign Application Priority Data

Dec. 30, 1995 [KR] Rep. of Korea .................. 95-69511

[51] Int. Cl.$^7$ ............................................ H01L 21/8234
[52] U.S. Cl. ........................ 438/238; 438/382; 438/250
[58] Field of Search ............................. 438/238, 239, 438/241, 250, 381, 382, 384, 393

[56] References Cited

U.S. PATENT DOCUMENTS

| | | | |
|---|---|---|---|
| 4,367,580 | 1/1983 | Guterman | 29/571 |
| 5,126,279 | 6/1992 | Roberts | 437/52 |
| 5,736,421 | 4/1998 | Shimomura | 437/52 |
| 5,767,544 | 6/1998 | Kuroda et al. | 257/318 |
| 5,780,333 | 7/1998 | Kim | 438/238 |

*Primary Examiner*—Charles Bowers
*Assistant Examiner*—Scott J. Hawranek

[57] ABSTRACT

A semiconductor device and a method of fabricating the same are disclosed. A resistor, a lower plate of an analog capacitor and a gate electrode of a MOS transistor are simultaneously formed over a substrate where an isolation film is formed. Junction region are formed at both sides of the gate in the substrate. A dummy gate electrode over the resistor where a first insulating layer is arranged between the resistor and the dummy gate electrode and an upper plate over the lower plate where a second insulating layer is arranged between the lower and upper plates, are simultaneously formed. A metal silicide layer is then formed over the dummy gate electrode, the resistor, the gate electrode, the junction regions and the lower and upper plates of the analog capacitor.

18 Claims, 4 Drawing Sheets

METHOD OF FABRICATING SEMICONDUCTOR DEVICE

BACKGROUND OF THE INVENTION

The present invention relates to a semiconductor device, and more particularly to an analog semiconductor device and a method of fabricating the same.

In general, an analog semiconductor device stores information of various states and is formed at the desired nodes of circuits. The analog semiconductor device includes a resistor and a capacitor and is for example, used for a timer in dynamic random access memory("DRAM"). Herein, the timer makes the DRAM to automatically refresh without separate instructions from the external. The timer generates a pulse signal for refresh with a long period of 1–100 $\mu$s within a chip. The period of the timer for refresh depends on the values of a resistor and a capacitor and is proportion to product of resistance and capacitance. At this time, a resistor is formed as a polysilicon layer and a capacitor includes lower and upper plates and a dielectric film between the plates. The resistance of the resistor depends on an impurity concentration doped in the polysilicon layer and is previously determined in depositing the polysilicon layer. The capacitance of the capacitor is proportion to squares lower and upper plates and dielectricity of the dielectric film.

Such analog semiconductor device is simultaneously formed with devices such as DRAMs including a MOS transistor and a storage capacitor. Herein, in order to obtain fast switching speed of a MOS transistor in DRAM, the MOS transistor is formed as n-type. In order to improve conductivity, a self aligned silicide layer is formed over the gate electrode and junction regions in the MOS transistor.

However, the silicide layer is formed over the gate electrode and junction regions as well as over the resistor and the capacitor plate. At this time, the resistance of the resistor which is previously determined in formation, is varied by the overlying silicide layer, thereby causing the problem such that the DRAMs does not store the desired values.

FIG. 1A through 1D are sectional views illustrating a process of fabricating a conventional analog semiconductor device. Referring to FIG. 1A, a field oxide 2 is formed over a semiconductor substrate 1 by LOCOS to define the device region AA. A gate oxide 3 and a polysilicon layer are formed over the substrate 1, in turn and then etched to form a resistor 41, a gate electrode 42 of a MOS transistor and a lower plate of an analog capacitor. At this time, the resistor 41 and the lower plate 43 of an analog capacitor are formed at the predetermined portion of the semiconductor substrate, for example over the field oxide 2 and the gate electrode 42 of a MOS transistor is formed on the substrate 1 of the device region AA.

Next, impurity ions of a predetermined conductivity type opposite to the semiconductor substrate 1 are implanted into the substrate 1 at the both sides of the gate 42, to form junction regions 5, thereby forming a MOS transistor. Then, a first insulation layer is formed over the substrate 1 and then anisotropically etched to form first sidewall spacers 6 of both sides of the resistor 41, the gate electrode 42, and the lower plate 43. Herein, the first spacers 6 are formed in order to be used in forming junction regions of a LDD structure and in forming a selfaligned silicide layer.

Afterwards, a dielectric layer 7 and a polysilicon layer 8 for an upper plate of an analog capacitor are formed respectively over the substrate 1, and a first photoresist pattern 9 for an upper plate of a capacitor is formed over the lower plate 43 by a photolithography. Herein, the width of the photoresist pattern 9 is smaller than the width of the lower plate 43.

Referring to FIG. 1B, the polysilicon layer 8 and the dielectric layer 7 are etched by using the photoresist pattern 9 as a mask, thereby forming an analog capacitor 10 including the lower and upper plates 43 and 8 and the dielectric layer 7. Then, the photoresist pattern 9 is removed and a second insulating layer is deposited over the substrate 1 and then anisotropically etched to form second sidewall spacers 11.

Next, a third insulating layer 12 is formed over the substrate 1 to a predetermined thickness and a second photoresist pattern 13 is formed on the third insulating layer 12 to expose the portion of the substrate 1 where the MOS transistor is formed.

Referring to FIG. 1C, the third insulating layer 12 is patterned by using the second photoresist pattern 13 as a mask and then the second photoresist pattern 13 is removed.

Next, a refractory metal is deposited over the substrate 1 to a predetermined thickness and then annealed to form self aligned silicide layer 14 on the gate electrode 42 and the junction regions 5. The remaining refractory metal which is not reacted in annealing, is removed by a wet etching or a dry etching.

Referring to FIG. 1D, an intermediate insulating layer 15 is formed over the substrate 1 and the intermediate insulating layer 15 and the third insulating layer 12 are etched to expose the resistor 41, junction regions 5 of the MOS transistor and the upper plate 8 of the analog capacitor 10, thereby forming contact holes. Then, a metal interconnection layer 16 is formed over the intermediate insulating layer 15 to contact with the resistor 41, the junction regions 5 and the upper plate 8 through the contact holes, respectively.

However, the conventional method of forming a silicide layer only over the device region become complicated with carrying out a separate additional photolithography process, thereby increasing the fabrication cost and reducing the production yield.

SUMMARY OF THE INVENTION

An object of the present invention is to provide an analog semiconductor device and a method of fabricating the same, where a silicide layer is formed only over the portion of a resistor which is contact with a metal interconnection layer, to prevent the resistance of the resistor from varying due to the formation of the silicide layer.

Another object of the present invention is to provide a method of fabricating an analog semiconductor device, which is simplified.

In accordance with one embodiment, there is provided a semiconductor device, including: a semiconductor substrate of a first conductivity type, where isolation regions and a device region between the isolation regions are defined; field oxides formed over the respective isolation regions of the substrate; an active element formed in the device region of the substrate; a resistor having a predetermined width, formed over one of the field oxides; a dummy gate electrode formed over at the predetermined portion of the resistor, the dummy gate electrode having a width smaller than that of the resistor; an analog capacitor formed over another field oxide, the analog capacitor including lower and upper plates having predetermined widths and a dielectric film between the lower and upper plates; and metal silicide layer formed over the active element, the resistor where the dummy gate electrode is not formed, the dummy gate electrode, and the lower and upper plates of the analog capacitor, respectively.

In the embodiment, the resistor, the dummy gate electrode, and the lower and upper plates of the analog capacitor is a doped polysilicon layer.

In the embodiment, the silicide layer is a refractory metal silicide such as W, Ti, or Ta.

In the embodiment, the semiconductor device further includes: an intermediate insulating layer formed over the substrate; contact holes formed in the intermediate insulating layer over the resistor, the active element, the lower and upper plates of the analog capacitor; and metal interconnection layers formed over the intermediate insulating layer to contact with the resistor, the active element, and the lower and upper plates of the analog capacitor through the contact holes.

There is also provided a method of fabricating a semiconductor device including a resistor, a metal oxide insulator transistor, an analog capacitor, comprising the steps of: providing a semiconductor substrate where an isolation film is formed; forming the resistor, a lower plate of the analog capacitor, and a gate electrode of the MOS transistor; forming junction regions at both sides of the gate in the substrate; forming a dummy gate electrode over the resistor and a upper plate of the analog capacitor over the lower plate; and forming a metal silicide layer over the dummy gate electrode, the resistor, the gate electrode, the junction regions, and the lower and upper plates of the analog capacitor.

In the embodiment, the formation step of the resistor, the lower plate and the gate electrode, includes the steps of: forming a gate oxide of the MOS transistor over the substrate; forming a conducting layer over the substrate; and etching the conducting layer to form the resistor over the isolation film, the gate electrode over the gate oxide and the lower plate over the isolation film, respectively.

In the embodiment, the method further includes: the step of forming insulating sidewall spacers at both sides of the resistor, the gate electrode, the lower plate between the formation step of the resistor, the gate electrode and the lower plate and the formation step of the junction regions.

In the embodiment, the formation step of the dummy gate electrode and the upper plate, includes the steps of: forming an insulating layer over the substrate where said resistor, the gate electrode and the lower plate are formed; forming a conducting layer over the insulating layer; and etching the conducting layer and the insulating layer to form the dummy gate electrode over the resistor and the upper plate over the lower plate.

In the embodiment, the conduction layer is a doped polysilicon layer.

In the embodiment, the method further includes the step of forming insulating sidewall spacers at both sides of the dummy gate electrode and the upper plate between the formation step of the dummy gate electrode and the upper plate and the formation step of the metal silicide layer.

In the embodiment, the method further includes the steps of: forming an intermediate insulating layer formed over the substrate, after the formation step of the metal silicide layer; etching the intermediate insulating layer to expose the resistor, the active element, the lower and upper plates of the analog capacitor, thereby contact holes; and forming metal interconnection layer over the intermediate insulating layer to contact with the exposed portion of the resistor, the active element, the lower and upper plates of the analog capacitor through the contact holes.

BRIEF DESCRIPTION OF THE DRAWINGS

The objects and feature of the invention may be better understood with reference to the following detailed description, appended claims, and attached drawings wherein:

DETAILED DESCRIPTION OF THE INVENTION

Figure 1A:
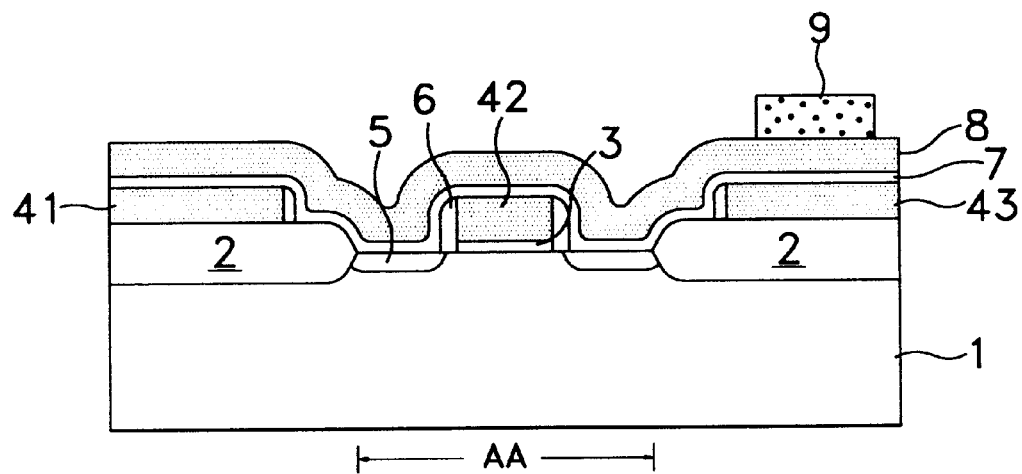
FIG. 1A through FIG. 1D are sectional views illustrating a process of fabricating a conventional analog semiconductor device.
Figure 1B:
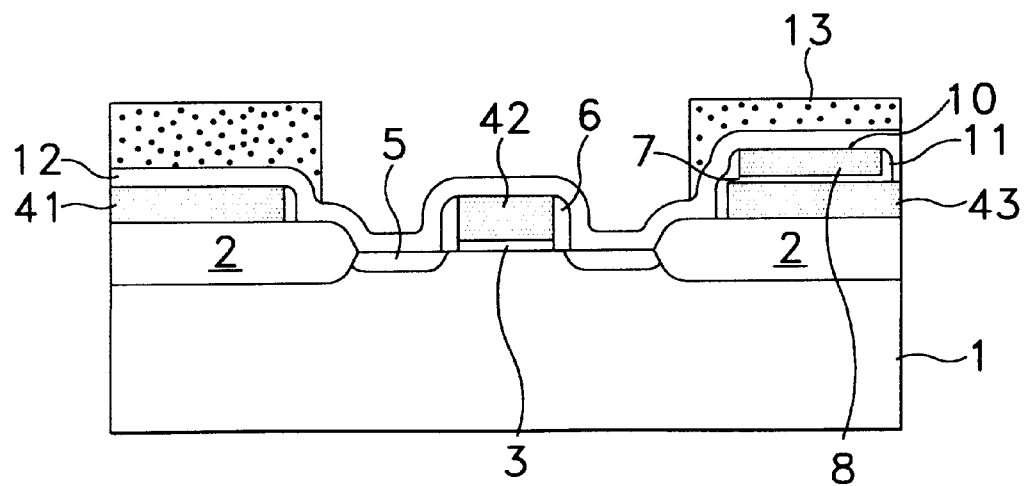
Figure 1C:
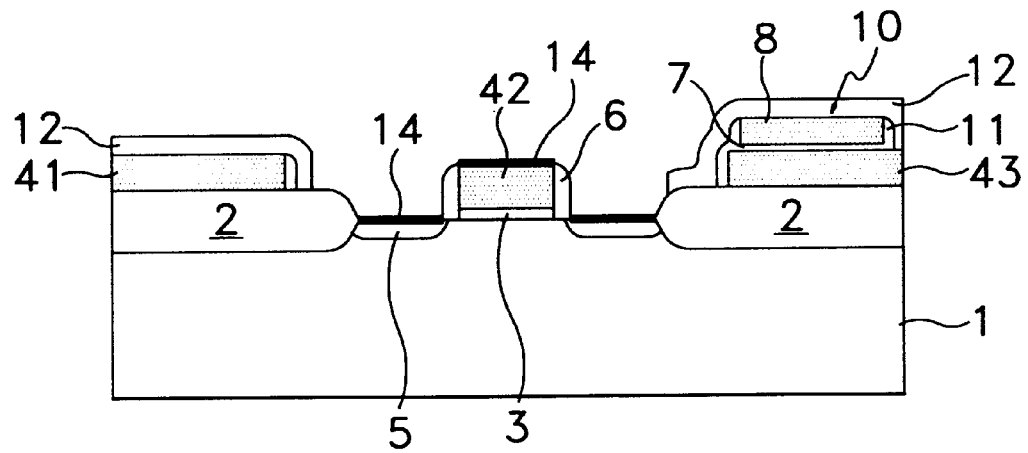
Figure 1D:
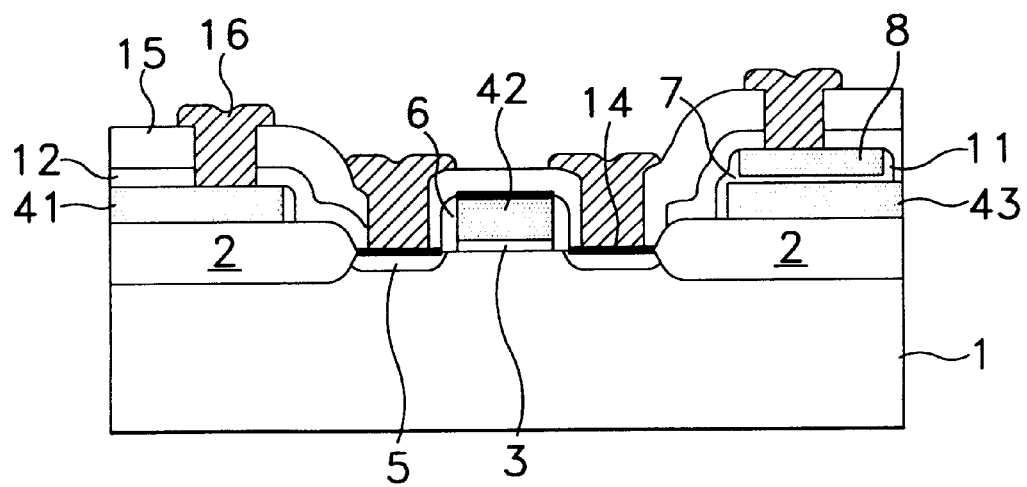
Figure 2A:
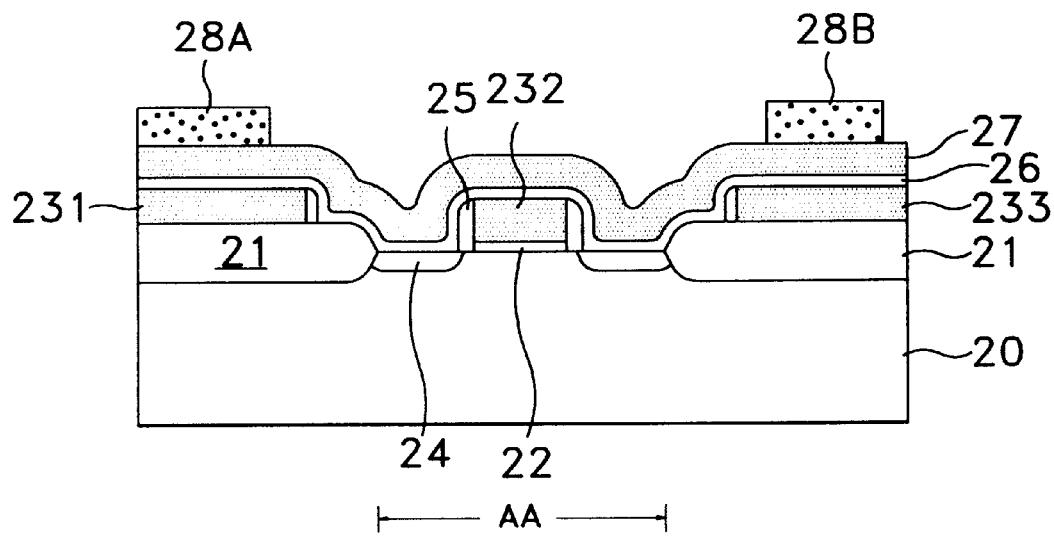
FIG. 2A through, 2D are sectional views illustrating a process of fabricating an analog semiconductor device in accordance with an embodiment of the present invention.

Referring to FIG. 2A, in accordance with an embodiment of the present invention, over a semiconductor substrate 20 of a first conductivity type, a field oxide 21 is formed by a conventional LOCOS to define a device region AA. A gate oxide 22 and a polysilicon layer are formed respectively over the substrate 20, and then etched to form a resistor 231, a gate electrode 232 of a MOS transistor and a lower plate 233. At this time, the polysilicon layer is doped with dopants of a predetermined conductivity. The resistor 231 and the lower plates 233 are formed over the field oxide 21 and the gate electrode 232 of a MOS transistor is formed over the substrate 21 of the device region AA.

Then, a junction region 24 is formed at both sides of the gate 232 in the substrate 20 by implanting impurity ions of a conductivity type opposite to that of the substrate 20, whereby a MOS transistor is formed. A first insulating layer is formed over the substrate 21 and then anisotropically etched to form first sidewall spacers 25 at both sides of the resistor 231, the gate electrode 232 and the lower plate 233.

Next, a dielectric film 26 and a polysilicon layer 27 are formed over the substrate 20, in turn. First and second photoresist patterns 28A and 28B for patterning an upper plate of an analog capacitor and a dummy gate electrode are formed over the resistor 231 and the lower plate 233 by a photolithography process. Herein the first photoresist pattern 28A is formed over the resistor 231. The first photoresist pattern is used as a mask for forming the dummy gate electrode for preventing a silicide layer from forming over the resistor 231. The second photoresist pattern 28B is used as a mask for an upper plate over the lower plate 233. The photoresist patterns 28A and 28B have widths smaller than those of the resistor 231 and the lower plate 233.

Figure 2B:
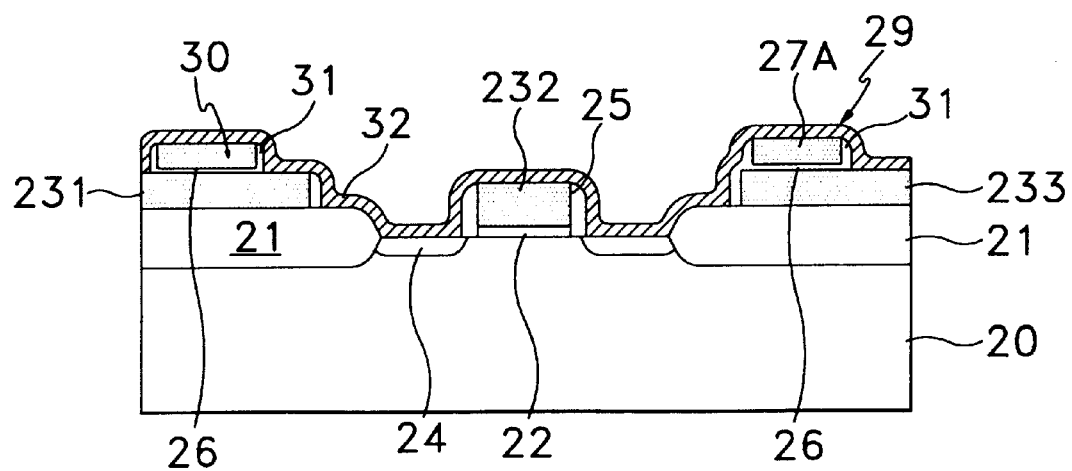

Referring to FIG. 2B, the polysilicon layer 27 and the dielectric film 26 are patterned by using the photoresist patterns 28A and 28B as masks, to form the upper plate 27A of an analog capacitor 29 and the dummy gate electrode 30. At this time, the dummy gate electrode 30 is formed to cover the resistor 231 except those predetermined portions to be in contact with a metal interconnection layer.

Next, the photoresist patterns 28A and 28B are removed, and a second insulating layer is formed over the substrate 20 and then anisotropically etched to form second sidewall spacers 31 at both sides of the upper plate 27A of the analog capacitor 29 and the dummy gate electrode 30. Then, a refractory metal 32 having a high melting point, such as W, Ti, or Ta is formed over the substrate 20.

Figure 2C:
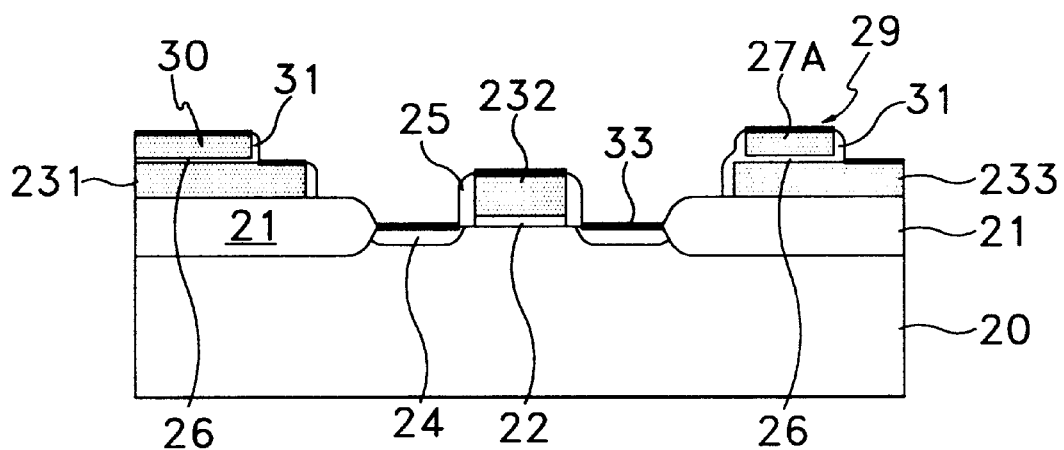

Referring to FIG. 2C, the substrate 20 where the refractory metal 32 is formed, undergoes an annealing process for a predetermined time. In the annealing process, the refractory metal 32 over the junction regions 24, the dummy gate electrode 30, the resistor 231, the gate electrode 232 and the upper plate 27A reacts with Si or Poly-Si, to form a silicide layer 33. The refractory metal 32, however, does not react with the insulating layer which remains as it is. Thus, the silicide layer 33 is formed only over the dummy gate electrode 30, the portion of the resistor 231 where the dummy gate electrode 30 is not formed, the gate electrode 232 and the junction regions of the device region AA, the lower and upper plates 233 and 27A of the analog capacitor 29. The remaining refractory metal 32 is removed by a wet etching or a dry etching. The silicide layer 33 can be formed by selective metal deposition technique. Herein, the silicide layer 33 which is formed over the resistor 231 does not affect the resistance of the resistor 231, but reduces the contact resistance at the metal contact which is to be formed hereinafter.

Figure 2D:
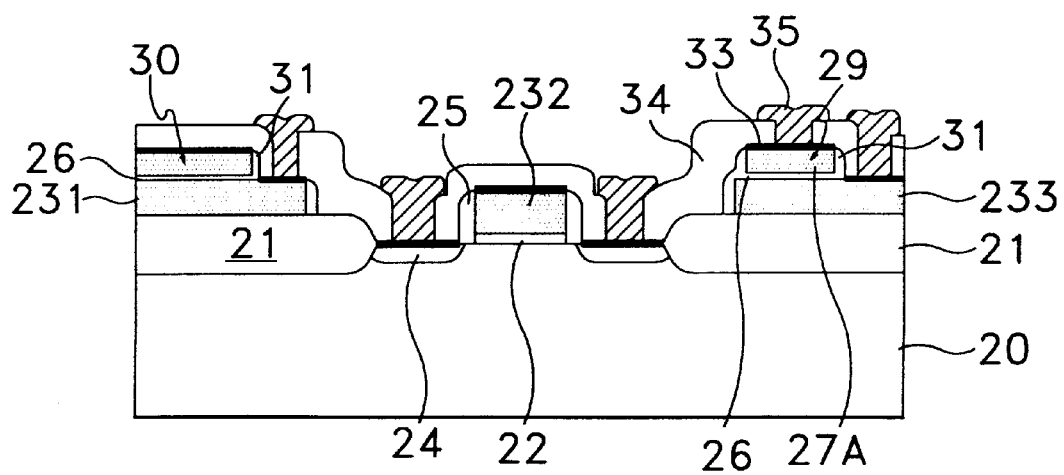

Referring to FIG. 2D, an intermediate insulation layer 34 is formed over the substrate 21 to a predetermined thickness and then etched to expose the resistor 231, the junction regions 24, and the lower and upper plates 233 and 27A of the analog capacitor 29, thereby forming contact holes. Then a metal interconnection layer 35 is formed over the intermediate insulating layer 34 to fill the contact holes, thereby contacting the above exposed portions, respectively. At this time, because the dummy gate electrode 30 is not contacted with the metal interconnection layer 35, it does not operate, but factors in preventing the silicide layer 33 from forming over the resistor 231.

According to the present invention, a dummy gate electrode is formed over a resistor except for the portion contacted with a metal interconnection layer, such that the contact resistance is reduced and the resistance of the resistor does not varied. Furthermore, a silicide layer is formed without a separate additional process, such that the fabrication process of an analog semiconductor device can be simplified.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of fabricating a semiconductor device including a resistor, a metal oxide insulator transistor, an analog capacitor, comprising the steps of:

providing a semiconductor substrate where an isolation film is formed;

forming said resistor, a lower plate of said analog capacitor, and a gate electrode of said MOS transistor;

forming junction regions at both sides of said gate electrode in said substrate;

forming a dummy gate electrode over said resistor and a upper plate of said analog capacitor over said lower plate; and forming a metal silicide layer over said dummy gate electrode, said resistor, said gate electrode, said junction regions, and said lower and upper plates of said analog capacitor;

wherein said formation step of said dummy gate electrode and said upper plate, includes the steps of:

forming an insulating layer over said substrate where said resistor, said gate electrode and said lower plate are formed;

forming a conducting layer over said insulating layer; and etching said conducting layer and said insulating layer to form said dummy gate electrode over said resistor and said upper plate over said lower plate.

2. The method as claimed in claim 1 wherein said formation step of said resistor, said lower plate and said gate electrode, includes the steps of:

forming a gate oxide of said MOS transistor over said substrate;

forming a conducting layer over said substrate; and etching said conducting layer to form said resistor over said isolation film, said gate electrode over said gate oxide and said lower plate over said isolation film, respectively.

3. The method as claimed in claim 2, wherein said conducting layer comprises a doped polysilicon layer.

4. The method as claimed in claim 1, further comprising the step of forming insulating sidewall spacers at both sides of said resistor, said gate electrode, said lower plate between said formation step of said resistor, said gate electrode and said lower plate and said formation step of said junction regions.

5. The method as claimed as claim 1, wherein said conducting layer comprises a doped polysilicon layer.

6. The method as claimed in claim 1, wherein said formation step of said metal silicide layer is carried out by a selective deposition method.

7. The method as claimed in claim 1, wherein said metal silicide layer comprises a refractory metal silicide layer.

8. The method as claimed in claim 7, wherein said refractory metal comprises any one of W, Ti or Ta.

9. The method as claimed in claim 1, further comprising the steps of:

forming an intermediate insulating layer formed over said substrate, after said formation step of said metal silicide layer;

etching said intermediate insulating layer to expose said resistor, said gate electrode and said junction regions, said lower and upper plates of said analog capacitor, thereby contact holes; and forming metal interconnection layer over said intermediate insulating layer to contact with said exposed portion of said resistor, said active element, said lower and upper plates of said analog capacitor through said contact holes.

10. A method of fabricating a semiconductor device including a resistor, a metal oxide insulator transistor, an analog capacitor, comprising the steps of:

providing a semiconductor substrate where an isolation film is formed;

forming said resistor, a lower plate of said analog capacitor, and a gate electrode of said MOS transistor;

forming junction regions at both sides of said gate electrode in said substrate;

forming a dummy gate electrode over said resistor and a upper plate of said analog capacitor over said lower plate; and forming a metal silicide layer over said dummy gate electrode, said resistor, said gate electrode, said junction regions, and said lower and upper plates of said analog capacitor; and further comprising the step of forming insulating sidewall spacers at both sides of said dummy gate electrode and said upper plate between said formation step of said dummy gate electrode and said upper plate and said formation step of said metal silicide layer;

wherein said formation step of said dummy gate electrode and said upper plate, includes the steps of:

forming an insulating layer over said substrate where said resistor, said gate electrode and said lower plate are formed;

forming a conducting layer over said insulating layer; and etching said conducting layer and said insulating layer to form said dummy gate electrode over said resistor and said upper plate over said lower plate.

11. The method as claimed in claim 10, wherein said formation step of said resistor, said lower plate and said gate electrode, includes the steps of:

forming a gate oxide of said MOS transistor over said substrate;

forming a conducting layer over said substrate; and etching said conducting layer to form said resistor over said isolation film, said gate electrode over said gate oxide and said lower plate over said isolation film, respectively.

12. The method as claimed in claim 11, wherein said conducting layer comprises a doped polysilicon layer.

13. The method as claimed in claim 10, further comprising the step of forming insulating sidewall spacers at both sides of said resistor, said gate electrode, said lower plate between said formation step of said resistor, said gate electrode and said lower plate and said formation step of said junction regions.

14. The method as claimed in claim 10, wherein said conducting layer comprises a doped polysilicon layer.

15. The method as claimed in claim 10, wherein said formation step of said metal silicide layer is carried out by a selective deposition method.

16. The method as claimed in claim 10, wherein said metal silicide layer comprises a refractory metal silicide layer.

17. The method as claimed in claim 16, wherein said refractory metal comprises any one of W, Ti or Ta.

18. The method as claimed in claim 10, further comprising the steps of:

forming an intermediate insulating layer formed over said substrate, after said formation step of said metal silicide layer;

etching said intermediate insulating layer to expose said resistor, said gate electrode and said junction regions, said lower and upper plates of said analog capacitor, thereby contact holes; and forming metal interconnection layer over said intermediate insulating layer to contact with said exposed portion of said resistor, said active element, said lower and upper plates of said analog capacitor through said contact holes.

* * * * *

UNITED STATES PATENT AND TRADEMARK OFFICE
CERTIFICATE OF CORRECTION

PATENT NO : 6,069,036
DATED : May 30, 2000
INVENTOR(S) : J. Kim

It is certified that error appears in the above-identified patent and that said Letters Patent are hereby corrected as shown below:

At col. 4, line 4, please cancel the "," after "through".

Signed and Sealed this

Twenty-fourth Day of April, 2001

Attest:

NICHOLAS P. GODICI

Attesting Officer

Acting Director of the United States Patent and Trademark Office